United States Patent [19]

Lee

[11] Patent Number: 5,621,698
[45] Date of Patent: Apr. 15, 1997

[54] DATA SIGNAL DISTRIBUTION CIRCUIT FOR SYNCHRONOUS MEMORY DEVICE

[75] Inventor: Jae J. Lee, Kyoungki-do, Rep. of Korea

[73] Assignee: Hyundai Electronics Industries Co., Ltd., Kyoungki-do, Rep. of Korea

[21] Appl. No.: 580,164

[22] Filed: Dec. 28, 1995

[30] Foreign Application Priority Data

Dec. 31, 1994 [KR]  Rep. of Korea ...................... 94-40590

[51] Int. Cl.$^6$ ..................................................... G11C 8/00
[52] U.S. Cl. ............................ 365/233; 365/193; 365/194
[58] Field of Search ..................................... 365/233, 193, 365/194

[56] References Cited

U.S. PATENT DOCUMENTS 5,107,465  4/1992  Fung et al. .......................... 365/233 X
5,414,672  5/1995  Ozeki et al. ............................ 365/233
5,475,646  12/1995  Ogihara .............................. 365/193 X Primary Examiner—Son T. Dinh
Attorney, Agent, or Firm—Reid & Priest LLP

[57] ABSTRACT

A data signal distribution circuit for a synchronous memory device comprising a data generation source for generating successive data signals in response to an external clock signal. The data signal distribution circuit comprises at least two control switches for switching the data signals from the data generation source to at least two peripheral circuits, a strobe signal generator for delaying the external clock signal by a propagation delay time of the data generation source and generating a strobe signal in response to the delayed external clock signal, and an internal address generator for generating an internal address signal in response to the strobe signal from the strobe signal generator and supplying the generated internal address signal to the control switches. The strobe signal has a predetermined logic level for a predetermined duration beginning with a pulse edge of the delayed external clock signal. The internal address signal has at least two bits, only one of which has the predetermined logic level.

5 Claims, 5 Drawing Sheets

DATA SIGNAL DISTRIBUTION CIRCUIT FOR SYNCHRONOUS MEMORY DEVICE

BACKGROUND OF THE INVENTION

1. Field of the Invention

The present invention relates in general to data signal distribution circuits for synchronous memory devices, and more particularly to a data signal distribution circuit for a synchronous memory device which is capable of accurately distributing successive data signals from a data generation source to at least two peripheral circuits, the data generation source being driven in response to an external clock signal.

2. Description of the Prior Art

Generally, a data signal distribution circuit for a synchronous memory device is adapted to generate internal address signals for designating at least two peripheral circuits to which successive data signals from a data generation source are to be transmitted. The data signal distribution circuit also controls a multiplexer for distributing the successive data signals from the data generation source to said at least two peripheral circuits in response to the internal address signals. However, the data signal distribution circuit generates the internal address signals in response to an external clock signal, thereby causing the internal address signals not to be synchronized with the successive data signals from the data generation source. For this reason, the data signal distribution circuit cannot accurately distribute the successive data signals from the data generation source to said at least two peripheral circuits. Such a problem with the data signal distribution circuit will hereinafter be described in detail with reference to FIGS. 1 to 3.

Referring to FIG. 1, there is shown the construction of a conventional data signal distribution circuit for a synchronous memory device. As shown in this drawing, the conventional data signal distribution circuit comprises a data generator 10 for generating successive data signals in response to a clock signal from a first control line 11 as shown in FIG. 2A, and an internal address generator 12 for inputting the clock signal from the first control line 11 and an external address signal from a second control line 13 as shown in FIG. 2D.

Preferably, the data generator 10 must generate a data signal string delayed for an interval shorter than a period of the clock signal from the first control line 11, as shown in FIG. 2B. However, the data generator 10 generates a data signal string delayed for an interval longer than the period of the clock signal from the first control line 11, as shown in FIG. 2C.

The internal address generator 12 is adapted to decode the clock signal from the first control line 11 and the external address signal from the second control line 13 to generate first and second internal address signals. To this end, the internal address generator 12 includes a NAND gate G1 and an inverter I2, for generating the first internal address signal, which is high in logic when the clock signal from the first control line 11 and the external address signal from the second control line 13 are both high in logic. The NAND gate G1 and the inverter I2 constitute a decoder. Also, the internal address generator 12 includes two inverters I1 and I3 and a NAND gate G2, for generating the second internal address signal, which is high in logic when the clock signal from the first control line 11 is high in logic and the external address signal from the second control line 13 is low in logic. Similarly, the inverters I1 and I3 and the NAND gate G2 constitute a decoder.

The conventional data signal distribution circuit further comprises a strobe signal generator 14 for generating a strobe signal in response to the clock signal from the first control line 11, and a clock controller 20 for transferring the strobe signal from the strobe signal generator 14 to a multiplexer 22 in response to the first and second internal address signals from the internal address generator 12.

The strobe signal generator 14 comprises a first delay circuit 16 for delaying the clock signal from the first control line 11 for a predetermined time period, and a second delay circuit 18, a NAND gate G3 and two inverters I4 and I5, for generating the strobe signal in response to the delayed clock signal from the first delay circuit 16, which has a predetermined high logic pulse width beginning with a rising edge of the delayed clock signal from the first delay circuit 16. The second delay circuit 18, the NAND gate G3 and the inverters I4 and I5 constitute an edge detector. Preferably, the strobe signal from the strobe signal generator 14 must have a pulse train delayed for an interval shorter than the period of the clock signal from the first control line 11, as shown in FIG. 2E. However, the strobe signal from the strobe signal generator 14 has a pulse train delayed for an interval longer than the period of the clock signal from the first control line 11, as shown in FIG. 2F. This reason is that the first delay circuit 16 in the strobe signal generator 14 delays the clock signal from the first control line 11 by a propagation delay time of the data generator 10.

The clock controller 20 is adapted to generate a first switching clock signal which is high in logic when the first internal address signal from the internal address generator 12 and the strobe signal from the strobe signal generator 14 are both high in logic. To this end, the clock controller 20 includes a NAND gate G4 and an inverter I6 constituting a decoder. The clock controller 20 is also adapted to generate a second switching clock signal which is high in logic when the second internal address signal from the internal address generator 12 and the strobe signal from the strobe signal generator 14 are both high in logic. To this end, the clock controller 20 includes a NAND gate G5 and an inverter I7 constituting a decoder.

The multiplexer 22 is adapted to multiplex the successive data signals from the data generator 10 to first and second output lines 15 and 17 in response to the first and second switching clock signals from the clock controller 20. To this end, the multiplexer 22 includes a first control switch for transferring the data signals from the data generator 10 to the peripheral circuit (not shown) connected to the first output line 15 when the first switching clock signal from the clock controller 20 is high in logic. The multiplexer 22 also includes a second control switch for transferring the data signals from the data generator 10 to the peripheral circuit (not shown) connected to the second output line 17 when the second switching clock signal from the clock controller 20 is high in logic. The first control switch is provided with an NMOS transistor Q1 and a PMOS transistor Q2 connected in parallel to each other and an inverter I8 connected between a gate of the NMOS transistor Q1 and a gate of the PMOS transistor Q2. The second control switch is provided with an NMOS transistor Q3 and a PMOS transistor Q4 connected in parallel to each other and an inverter I9 connected between a gate of the NMOS transistor Q3 and a gate of the PMOS transistor Q4.

Preferably, the first control switch in the multiplexer 22 must transfer first and third data signals d1 and d3 from the data generator 10 to the first output line 15 at first and third periods of the clock signal from the first control line 11, respectively, as shown in FIG. 2G. However, the first control switch in the multiplexer 22 does not transfer the first data signal d1 from the data generator 10 to the first output line 15 at the first period of the clock signal from the first control line 11 but at a second period of the clock signal, as shown in FIG. 2H. Also, preferably, the second control switch in the multiplexer 22 must transfer a second data signal d2 from the data generator 10 to the second output line 17 at the second period of the clock signal from the first control line 11, as shown in FIG. 2I. However, the second control switch in the multiplexer 22 does not transfer the second data signal d2 from the data generator 10 to the second output line 17 at the second period of the clock signal from the first control line 11 but the third period of the clock signal, as shown in FIG. 2J.

Referring to FIG. 3, there is shown the construction of an alternative embodiment of the internal address generator 12 in FIG. 1. As shown in this drawing, the internal address generator 12 is provided with a 1 bit counter for counting the clock signal from the first control line 11 while an enable signal from a third control line 19 is high in logic. As a result of the counting operation, the 1 bit counter generates first and second internal address signals with the opposite logic levels. To this end, the 1 bit counter includes two NAND gates G6 and G7, two NMOS transistors Q5 and Q8, two PMOS transistors Q6 and Q7 and six inverters I10–I15.

As mentioned above, in the conventional data signal distribution circuit for the synchronous memory device, the internal address signals from the internal address generator 12 are not synchronized with the successive data signals from the data generator 10. For this reason, the conventional data signal distribution circuit cannot accurately distribute the successive data signals from the data generator 10 to the peripheral circuits.

SUMMARY OF THE INVENTION

Therefore, the present invention has been made in view of the above problem, and it is an object of the present invention to provide a data signal distribution circuit for a synchronous memory device in which internal address signals for designating peripheral circuits to which successive data signals from a data generation source are to be transmitted are accurately synchronized with the data signals, so that the data signals can accurately be distributed to the peripheral circuits.

In accordance with an aspect of the present invention, in a synchronous memory device comprising a data generation source for generating successive data signals in response to an external clock signal, there is provided a data signal distribution circuit comprising at least two switching means for switching the data signals from the data generation source to at least two peripheral circuits; strobe signal generation means for delaying the external clock signal by a propagation delay time of the data generation source and generating a strobe signal in response to the delayed external clock signal, said strobe signal having a predetermined logic level for a predetermined duration beginning with a pulse edge of the delayed external clock signal; and internal address generation means for generating an internal address signal in response to the strobe signal from the strobe signal generation means and supplying the generated internal address signal to the switching means, the internal address signal having at least two bits, only one of which has the predetermined logic level.

The data signal distribution circuit further comprises address synchronization means for synchronizing the internal address signal from the internal address generation means with the strobe signal from the strobe signal generation means.

In accordance with another aspect of the present invention, in a synchronous memory device comprising a data generation source for generating successive data signals in response to an external clock signal, there is provided a data signal distribution circuit comprising delay means for delaying the external clock signal by a propagation delay time of the data generation source; data conversion means for converting the data signals from the data generation source into true and complementary data signals in response to the delayed external clock signal from the delay means; at least two true switching means for transferring the true data signal from the data conversion means to peripheral circuits connected to at least two true output lines; at least two complementary switching means for transferring the complementary data signal from the data conversion means to peripheral circuits connected to at least two complementary output lines; logic combination means for logically combining the true and complementary data signals from the data conversion means to generate a data clock signal; and internal address generation means for generating an internal address signal in response to the data clock signal from the logic combination means and supplying the generated internal address signal to the true and complementary switching means, the internal address signal having at least two bits, only one of which has a predetermined logic level.

The data signal distribution circuit further comprises address synchronization means for synchronizing the internal address signal from the internal address generation means with the delayed external clock signal from the delay means.

The data signal distribution circuit further comprises at least four storage means, each of the storage means holding a corresponding one of the true and complementary data signals on the true and complementary output lines, transferred by the true and complementary switching means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
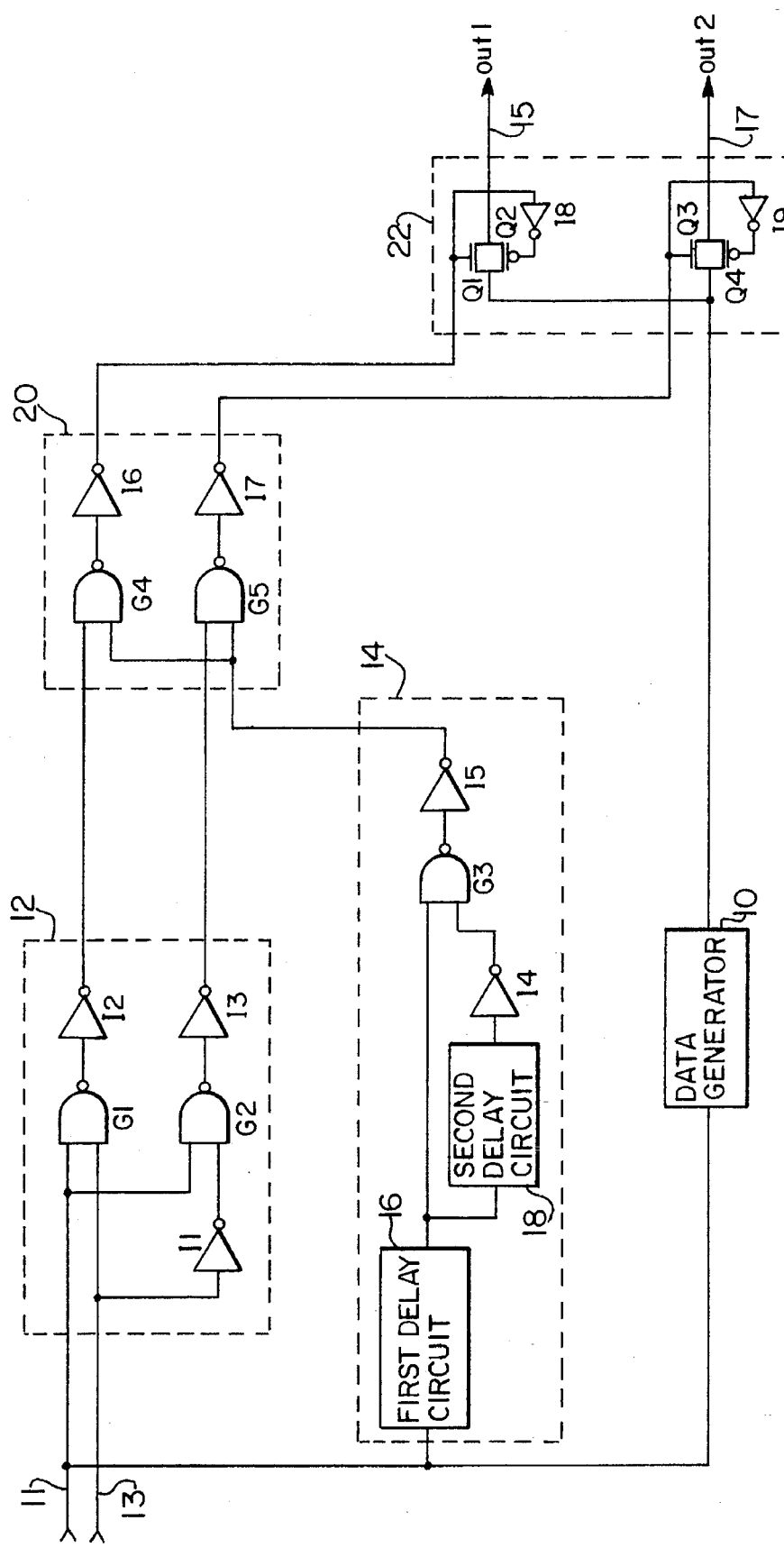
FIG. 1 is a circuit diagram illustrating the construction of a conventional data signal distribution circuit for a synchronous memory device.
Figure 2:
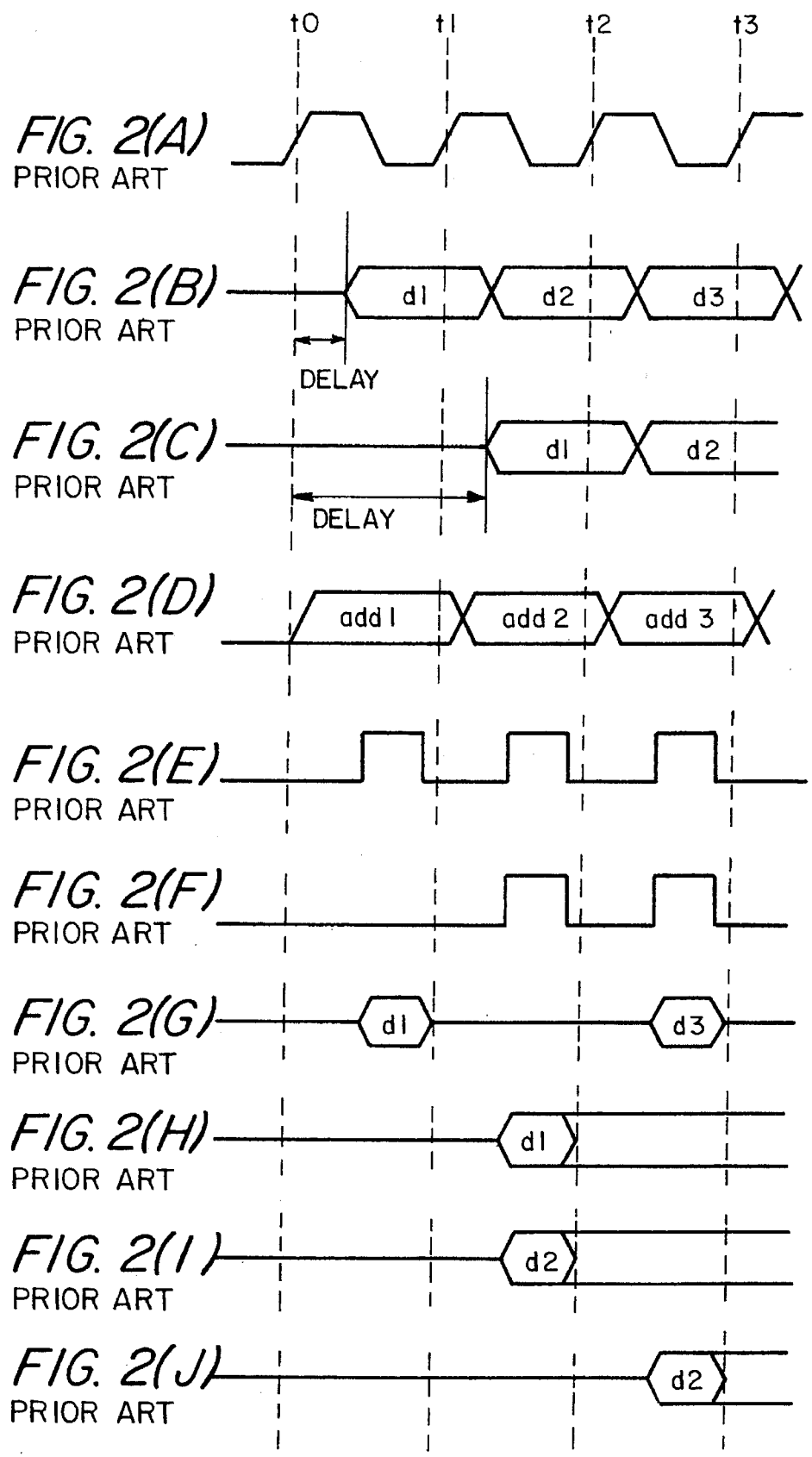
FIGS. 2A to 2J are timing diagrams illustrating the operation of the conventional data signal distribution circuit in FIG. 1.
Figure 3:
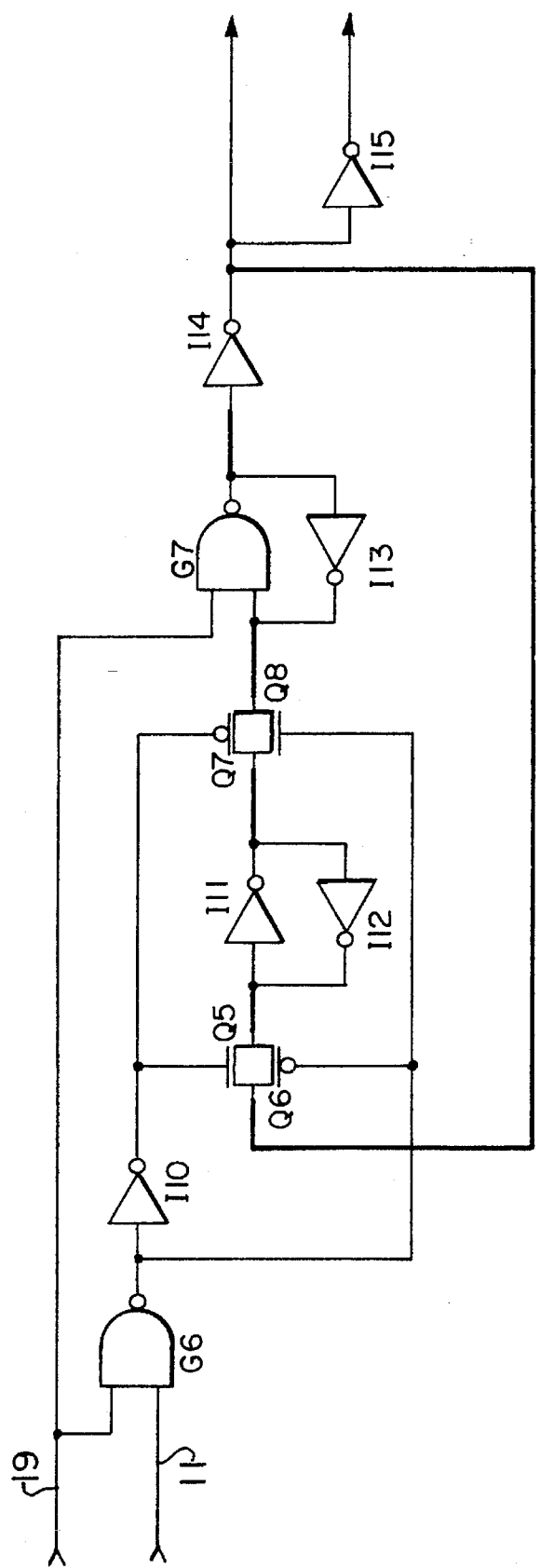
FIG. 3 is a circuit diagram illustrating the construction of an alternative embodiment of an internal address generator in FIG. 1.
Figure 4:
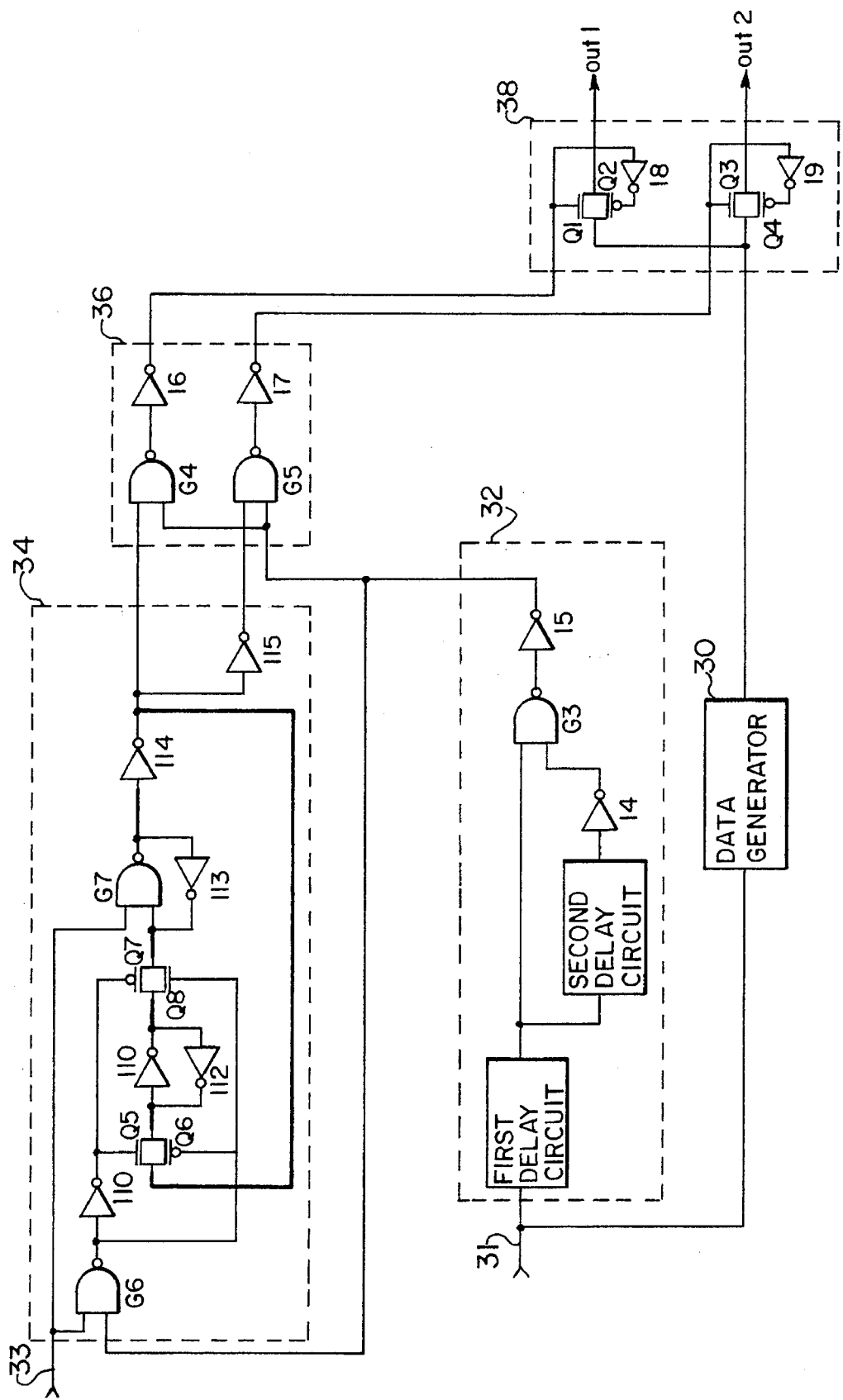
FIG. 4 is a circuit diagram illustrating the construction of a data signal distribution circuit for a synchronous memory device in accordance with an embodiment of the present invention.

Referring to FIG. 4, there is shown the construction of a data signal distribution circuit for a synchronous memory device in accordance with an embodiment of the present invention. As shown in this drawing, the data signal distribution circuit comprises a data generator 30 for generating successive data signals in response to a clock signal from a first control line 31. The data generator 30 is adapted to generate a data signal string delayed by a propagation delay time thereof from the clock signal from the first control line 31.

The data signal distribution circuit further comprises a strobe signal generator 32 for generating a strobe signal in response to the clock signal from the first control line 31, and a clock controller 36 for transferring the strobe signal from the strobe signal generator 32 to a multiplexer 38. The strobe signal generator 32 includes a first delay circuit 16 for delaying the clock signal from the first control line 31 for a predetermined time period, and a second delay circuit 18, a NAND gate G3 and two inverters I4 and I5, for generating the strobe signal in response to the delayed clock signal from the first delay circuit 16, which has a predetermined high logic pulse width beginning with a rising edge of the delayed clock signal from the first delay circuit 16. The second delay circuit 18, the NAND gate G3 and the inverters I4 and I5 constitute an edge detector. The first delay circuit 16 delays the clock signal from the first control line 31 by the propagation delay time of the data generator 30.

The data signal distribution circuit further comprises an internal address generator 34 for counting the strobe signal from the strobe signal generator 32 while an enable signal from a second control line 33 is high in logic. As a result of the counting operation, the internal address generator 34 generates first and second internal address signals with the opposite logic levels. To this end, the internal address generator 34 is provided with a 1 bit counter including two NAND gates G6 and G7, two NMOS transistors Q5 and Q8, two PMOS transistors Q6 and Q7 and six inverters I10–I15. In the preferred embodiment of the present invention, the internal address generator 34 is provided with the 1 bit counter because the output lines are two in number. But, in the case where the output lines are at least three in number, the internal address generator 34 may include an at least 2-bit counter and a logic combination circuit. Noticeably, the first and second internal address signals from the internal address generator 34 are synchronized with the data signals from the data generator 10 and the strobe signal from the strobe signal generator 32.

The clock controller 36 is adapted to generate a first switching clock signal which is high in logic when the first internal address signal from the internal address generator 34 and the strobe signal from the strobe signal generator 32 are both high in logic. To this end, the clock controller 36 includes a NAND gate G4 and an inverter I6 constituting a decoder. The clock controller 36 is also adapted to generate a second switching clock signal which is high in logic when the second internal address signal from the internal address generator 34 and the strobe signal from the strobe signal generator 32 are both high in logic. To this end, the clock controller 36 includes a NAND gate G5 and an inverter I7 constituting a decoder. The clock controller 36 then supplies the generated first and second switching clock signals to the multiplexer 38. Noticeably, the first and second switching clock signals from the clock controller 36 are synchronized with the data signals from the data generator 10.

The multiplexer 38 is adapted to accurately multiplex the successive data signals from the data generator 10 to first and second output lines 35 and 37 in response to the first and second switching clock signals from the clock controller 36. Such a multiplexing operation of the multiplexer 38 results from the first and second switching clock signals from the clock controller 36 being synchronized with the data signals from the data generator 10. The multiplexer 38 includes a first control switch for transferring the data signals from the data generator 10 to the peripheral circuit (not shown) connected to the first output line 35 when the first switching clock signal from the clock controller 36 is high in logic. The multiplexer 38 also includes a second control switch for transferring the data signals from the data generator 10 to the peripheral circuit (not shown) connected to the second output line 37 when the second switching clock signal from the clock controller 36 is high in logic. The first control switch is provided with an NMOS transistor Q1 and a PMOS transistor Q2 connected in parallel to each other and an inverter I8 connected between a gate of the NMOS transistor Q1 and a gate of the PMOS transistor Q2. The second control switch is provided with an NMOS transistor Q3 and a PMOS transistor Q4 connected in parallel to each other and an inverter I9 connected between a gate of the NMOS transistor Q3 and a gate of the PMOS transistor Q4.

Figure 5:
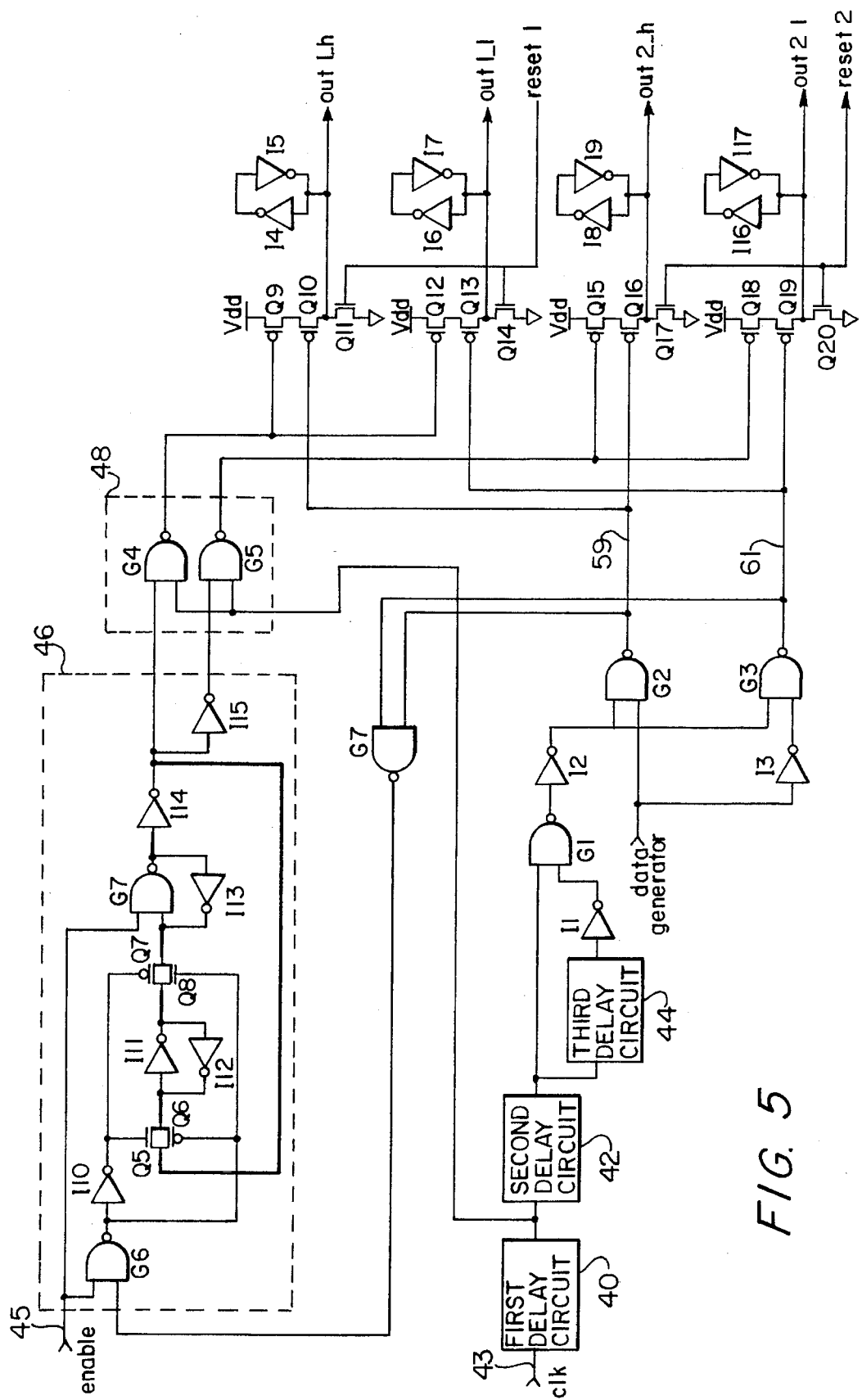
FIG. 5 is a circuit diagram illustrating the construction of a data signal distribution circuit for a synchronous memory device in accordance with an alternative embodiment of the present invention.

Referring to FIG. 5, there is shown the construction of a data signal distribution circuit for a synchronous memory device in accordance with an alternative embodiment of the present invention. As shown in this drawing, the data signal distribution circuit comprises a NAND gate G2 and an inverter I3 for commonly inputting successive data signals from a data generator (not shown) through an input line 41, and first and second delay circuits 40 and 42 connected in series to a first control line 43. The first and second delay circuits 40 and 42 delay a clock signal from the first control line 43 for an interval from the clock signal to the output of data signal from the data generator. The first and second delay circuits 40 and 42 then supply the delayed clock signal to a third delay circuit 44 and a NAND gate G1. The third delay circuit 44 and NAND gate G1 constitute an edge detector together with two inverters I1 and I2, for generating a strobe signal which has a predetermined high logic pulse width beginning with a rising edge of the delayed clock signal from the first and second delay circuits 40 and 42. The edge detector then supplies the generated strobe signal to two NAND gates G2 and G3. The NAND gate G2 NANDs the strobe signal from the edge detector and the data signal from the input line 41. In accordance with the NANDed result, the NAND gate G2 generates a true data signal which has a low logic pulse when the data signal from the input line 41 is 1 in logic. The NAND gate G2 then supplies the generated true data signal to a node 59. The NAND gate G3 NANDs the strobe signal from the edge detector and the inverted data signal from the inverter I3. In accordance with the NANDed result, the NAND gate G3 generates a complementary data signal which has a low logic pulse when the data signal from the input line 41 is 0 in logic. The NAND gate G3 then supplies the generated complementary data signal to a node 61.

The data signal distribution circuit further comprises a NAND gate G7 for inputting the true and complementary data signals from the nodes 59 and 61, and an internal address generator 46 for inputting an output signal from the NAND gate G7 and an enable signal from a second control line 45. The NAND gate G7 is adapted to generate a data clock signal which has a high logic pulse when at least one of the true and complementary data signals from the nodes 59 and 61 has a low logic pulse. The NAND gate G7 then supplies the generated data clock signal to the internal address generator 46.

The internal address generator 46 is adapted to count the data clock signal from the NAND gate G7 while the enable signal from the second control line 45 is high in logic. As a result of the counting operation, the internal address generator 46 generates first and second internal address signals with the opposite logic levels. To this end, the internal address generator 46 is provided with a 1 bit counter including two NAND gates G6 and G7, two NMOS transistors Q5 and Q8, two PMOS transistors Q6 and Q7 and six inverters I10–I15. In the preferred embodiment of the present invention, the internal address generator 46 is provided with the 1 bit counter because the true and complementary output lines are two in number. But, in the case where the true and complementary output lines are at least three in number, the internal address generator 46 may include an at least 2-bit counter and a logic combination circuit. Noticeably, the first and second internal address signals from the internal address generator 46 are synchronized with the data signals from the data generator.

The data signal distribution circuit further comprises a clock controller 48 for inputting the first and second internal address signals from the internal address generator 46 and the delayed clock signal from the first delay circuit 40. The clock controller 48 includes a NAND gate G4 for generating a first switching clock signal which is low in logic when the first internal address signal from the internal address generator 46 and the delayed clock signal from the first delay circuit 40 are both high in logic. The clock controller 48 also includes a NAND gate G5 for generating a second switching clock signal which is low in logic when the second internal address signal from the internal address generator 46 and the delayed clock signal from the first delay circuit 40 are both high in logic. Noticeably, the first and second switching clock signals from the clock controller 48 are synchronized with the data signals from the data generator. The first switching clock signal from the clock controller 48 is applied to first and second control switches and the second switching clock signal therefrom is applied to third and fourth control switches.

The first control switch is adapted to invert the low logic true data signal from the node 59 when the first switching clock signal from the clock controller 48 is low in logic. The first control switch then transfers the resultant high logic true data signal to a first true output line 47. The first control switch also initializes a value of the true data signal on the first true output line 47 in response to a first reset signal from a first peripheral circuit (not shown) being applied thereto through a third control line 55. To this end, the first control switch includes two PMOS transistors Q9 and Q10 and an NMOS transistor Q11. The second control switch is adapted to invert the low logic complementary data signal from the node 61 when the first switching clock signal from the clock controller 48 is low in logic. The second control switch then transfers the resultant high logic complementary data signal to a first complementary output line 49. The second control switch also initializes a value of the complementary data signal on the first complementary output line 49 in response to the first reset signal from the first peripheral circuit being applied thereto through the third control line 55. To this end, the second control switch includes two PMOS transistors Q12 and Q13 and an NMOS transistor Q14.

The third control switch is adapted to invert the low logic true data signal from the node 59 when the second switching clock signal from the clock controller 48 is low in logic. The third control switch then transfers the resultant high logic true data signal to a second true output line 51. The third control switch also initializes a value of the true data signal on the second true output line 51 in response to a second reset signal from a second peripheral circuit (not shown) being applied thereto through a fourth control line 57. To this end, the third control switch includes two PMOS transistors Q15 and Q16 and an NMOS transistor Q17. The fourth control switch is adapted to invert the low logic complementary data signal from the node 61 when the second switching clock signal from the clock controller 48 is low in logic. The fourth control switch then transfers the resultant high logic complementary data signal to a second complementary output line 53. The fourth control switch also initializes a value of the complementary data signal on the second complementary output line 53 in response to the second reset signal from the second peripheral circuit being applied thereto through the fourth control line 57. To this end, the fourth control switch includes two PMOS transistors Q18 and Q19 and an NMOS transistor Q20.

The data signal distribution circuit further comprises first to fourth storage devices, each of which forms a circulating loop on a corresponding one of the first true and complementary output lines 47 and 49 and the second true and complementary output lines 51 and 53. The first storage device is adapted to hold the true data signal on the first true output line 47, transferred by the first control switch. To this end, the first storage device includes two inverters I4 and I5. The second storage device is adapted to hold the complementary data signal on the first complementary output line 49, transferred by the second control switch. To this end, the second storage device includes two inverters I6 and I7. The third storage device is adapted to hold the true data signal on the second true output line 51, transferred by the third control switch. To this end, the third storage device includes two inverters I8 and I9. The fourth storage device is adapted to hold the complementary data signal on the second complementary output line 53, transferred by the fourth control switch. To this end, the fourth storage device includes two inverters I16 and I17.

As apparent from the above description, according to the present invention, the data signal distribution circuit for the synchronous memory device delays the external clock signal by the propagation delay time of the data generator and generates the internal address signals in response to the delayed clock signal to accurately synchronize the internal address signals with the data signals from the data generator. Therefore, the data signal distribution circuit for the synchronous memory device can accurately designate the output lines to which the data signals from the data generator are to be transferred, so as to accurately distribute the data signals from the data generator to the peripheral circuits.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. In a synchronous memory device comprising a data generation source for generating successive data signals in response to an external clock signal, a data signal distribution circuit comprising:

delay means for delaying the external clock signal by a propagation delay time of said data generation source;

data conversion means for converting the data signals from said data generation source into true and complementary data signals in response to the delayed external clock signal from said delay means;

at least two true switching means for transferring the true data signal from said data conversion means to peripheral circuits connected to at least two true output lines;

at least two complementary switching means for transferring the complementary data signal from said data conversion means to peripheral circuits connected to at least two complementary output lines;

logic combination means for logically combining the true and complementary data signals from said data conversion means to generate a data clock signal; and internal address generation means for generating an internal address signal in response to the data clock signal from said logic combination means and supplying the generated internal address signal to said true and complementary switching means, said internal address signal having at least two bits, only one of which has a predetermined logic level.

2. A data signal distribution circuit as set forth in claim 1, further comprising address synchronization means for synchronizing the internal address signal from said internal address generation means with the delayed external clock signal from said delay means.

3. A data signal distribution circuit as set forth in claim 1, wherein each of said true and complementary switching means includes first and second MOS transistors connected between a supply voltage source and a corresponding one of said true and complementary output lines, said first MOS transistor being driven in response to the internal address signal from said internal address generation means, said second MOS transistor being driven in response to a corresponding one of the true and complementary data signals from said data conversion means.

4. A data signal distribution circuit as set forth in claim 3, further comprising at least four storage means, each of said storage means holding a corresponding one of the true and complementary data signals on said true and complementary output lines, transferred by said first and second MOS transistors in said true and complementary switching means.

5. A data signal distribution circuit as set forth in claim 4, wherein each of said true and complementary switching means further includes a third MOS transistor connected between a ground voltage source and a corresponding one of said true and complementary output lines, for initializing the true or complementary data signal on said corresponding true or complementary output line, held by a corresponding one of said storage means, in response to a reset signal from the peripheral circuit connected to said corresponding true or complementary output line.

\* \* \* \* \*